US007176776B1

(12) United States Patent
Tantwai et al.

(10) Patent No.: US 7,176,776 B1
(45) Date of Patent: Feb. 13, 2007

(54) MULTI-LAYER RF FILTER AND BALUN

(75) Inventors: Kranti K. Tantwai, Bangalore (IN); Manjusha Dawande, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/417,409

(22) Filed: May 4, 2006

(51) Int. Cl.
*H01F 5/00* (2006.01)
(52) U.S. Cl. ..................................... 336/200
(58) Field of Classification Search ................ 336/200
See application file for complete search history.

(56) References Cited

OTHER PUBLICATIONS

Soshin Electric Co., Ltd., "Development Information," Feb. 17, 2003 (1 page).
Wing-Yan Leung et al., "Multilayer LTCC Bandpass Filter Design With Enhanced Stopband Characteristics," Jul. 2002 (pp. 240-242).
Ching-Wen Tang et al., "A Semi-lumped Balun Fabricated by Low Temperature Co-fired Ceramic," 2002 (pp. 2201-2204).
A. Sutono et al., "Development of Integrated Three Dimensional Bluetooth Image Reject Filter," 2000 (pp. 339-342).
Chih-ming Tsai et al., "A Generalized Model for Coupled Lines and its Applications to Two-Layer Planar Circuits," Dec. 1992 (pp. 2190-2199).
Nathan Marchand, "Transmission-Line Conversion," Dec. 1944 (pp. 142-145).
Toko, Inc., "Multilayer tip balun filter for XM radio" (1 page).
CTS Microelectronics, "Low-Temperature Cofired Ceramic Design and Layout Guidelines for the Fabrication of Networks, Packages and Multichip Modules" (pp. 1-14).
EPOCS, "LTCC Design Guidelines" (5 pages).

*Primary Examiner*—Elvin Enad
(74) *Attorney, Agent, or Firm*—Jimmy L. Funke (57) ABSTRACT

A filter-balun combination for filtering an RF input signal and balancing output RF signals is provided. The filter-balun combination is formed in a multi-layer planar substrate having multiple dielectric layers and multiple planar device layers having conducting material. The filter section includes first and second symmetrical inductors formed in the substrate. The inductors provide filtering for an input signal. The balun section includes a balun central transmission line connected to an output of the filter, and two output structures for providing the output from the filter-balun combination. The central transmission line follows a path through the substrate that includes first and second coil areas. The input line is sandwiched between upper and lower transmission lines in the first and second coil areas. The output of the filter-balun combination is a filtered, balanced signal at each of the two balun output structures.

21 Claims, 6 Drawing Sheets

MULTI-LAYER RF FILTER AND BALUN

TECHNICAL FIELD

The present invention is generally directed to RF signal processing circuitry, and, more specifically, to radio-frequency (RF) filter and balun circuitry implemented in multiple layers of a multi-layer substrate.

BACKGROUND OF THE INVENTION

Satellite digital audio radio services (SDARS) have become increasingly popular, offering digital radio services covering large geographic areas, such as North America. XM Satellite Radio is one example of satellite digital audio radio services. These services typically receive uplinked programming, which, in turn, is rebroadcast directly to digital radios that subscribe to the service. Each subscriber to the service generally possesses a digital radio having a receiver and antenna for receiving the digital broadcast. Although many digital radios have been designed for use in vehicles, other digital radios are increasingly being designed for use in the home or office environment, and for personal portable or wearable usage, including in outdoor environments.

In SDARS systems, the digital satellite receivers are generally programmed to receive and decode digital satellite signals, which typically include many channels of digital audio. These signals are received directly from satellites, or from terrestrial repeaters that retransmit the digital satellite signals in order to provide improved coverage and availability. In addition to broadcasting encoded digital quality audio signals, the satellite service may also transmit data that may be used for various other applications. The broadcast signals may include advertising, information about warranty issues, information about the broadcast audio programs, and news, sports, and entertainment programming. Thus, the digital broadcasts may be employed for any of a number of satellite audio radio, satellite television, satellite Internet, and various other consumer services.

A signal received by a digital satellite receiver is generally filtered and amplified by circuitry in the receiver prior to being provided as an output signal from the receiver. One reason for filtering the received signal is to remove unwanted signal components associated with the received signal that can interfere with or distort the desired information contained in the received signal. Image frequencies are one example of unwanted signal components that can be removed by receiver filter circuitry. One technique used in receivers to suppress or remove Image frequency signals is to use an image reject filter. Typically, this is a band-pass filter with a good image reject ratio. If the output signal from the filter is an unbalanced signal, the output from the filter can be provided to a balun in order to convert the unbalanced signal from the filter into a balanced differential signal that can be processed by additional receiver circuitry, such as, for example, a mixer.

Typical desired characteristics of filters employed as discussed above may include low cost, small size to allow for efficient use of board or substrate real-estate, ease of integration with other circuit components, precise stop and pass-band frequencies, precise center frequencies, high image reject ratios, and low insertion loss. Typical desired characteristics of baluns employed as discussed above may include low cost, small size for efficient use of board or substrate real-estate, ease of integration with other circuit components, tight signal coupling between the balun input and output, output amplitude balance, phase balance and low insertion loss.

In traditional receiver designs, baluns and filters may be implemented in discrete, packaged devices that are mounted to the receiver printed circuit board or substrate. Discrete components implementing baluns, filters and combinations of baluns and filters are currently marketed by companies such as Toko, Inc. and Soshin Electric Co., Ltd. While the use of discrete baluns, filters, and combinations of baluns and filters can be effective in processing signals received by digital satellite receivers, such discrete components can consume scarce board or substrate real-estate, can be expensive, and can provide sub-optimal performance with respect to other important filter and balun characteristics noted above.

As an alternative to the discrete devices noted above, filters and baluns may be implemented as structures formed by embedded or implanted metal lines in multi-layer ceramic substrates such as low-temperature co-fired ceramic substrates (LTCC). Generally, these devices are formed using multiple layers in a multi-layer substrate. While these devices can be effective in processing signals received by digital satellite receivers, and can potentially reduce cost and board or substrate use relative to discrete components, process variation across layers and other factors can make it difficult to precisely align and form the elements needed to create filter and balun devices that closely meet design requirements.

When a bandpass filter is created in a multi-layer substrate, it is often created with parallel LC resonators formed from capacitors and inductors connected to ground planes through multiple vias. In order for the filter to perform as designed, it is typically desirable to have the inductance of the parallel resonators be as closely matched as possible. However, because each inductor is typically formed across multiple different layers in the substrate, process variation and differences in each layer make it difficult to match the inductances. Connecting the inductors to multiple ground planes through multiple vias can also make matching inductances difficult. This is due in part to the fact that the ground planes and vias may have different physical characteristics, causing them to contribute differently to the inductances of each LC resonator. Finally, attempts to create a bandpass filter with low insertion loss by altering the dielectric constant of layers in the vicinity of the LC resonator can make it difficult to match the inductances when the inductors are formed across multiple different layers.

When a balun is created in a multi-layer substrate, it is typically created by running an electromagnetically coupled input line and output line through different layers of the structure. Generally, the input line will be in one layer, the output line will be in a different layer, and the two lines are separated by a dielectric layer. It is generally desirable in a balun to have the input and output lines in separate layers overlapping each other so that the signals in each line are as tightly coupled as possible. However, process variations among the layers can make it difficult to have the path of the input line precisely match the path of the output line, resulting in unwanted coupling effects. In addition, attention must be paid to where the lines are run relative to other substrate structures in order to avoid unwanted coupling. The result is that the coupled lines might not be able to follow the most space-efficient path through the substrate. Finally, by only coupling the input line to one output line, the length of the 2 lines may be longer than necessary.

What is needed is a more effective balun filter combination embedded in a substrate, including a filter section with parallel LC resonator structures in which the inductance of the parallel structures can be closely matched in spite of process variation among different layers, changes to various layers to reduce insertion loss, and grounding of the inductors. What is also needed is a balun section in which input and output lines are more tightly coupled, less susceptible to coupling to other circuit structures, shorter, and more efficiently routed in order to reduce size.

SUMMARY OF THE INVENTION

In accordance with one aspect of the present invention, a filter-balun combination for filtering an input signal and balancing output signal lines is provided. The filter-balun combination is formed in a multi-layer planar substrate having multiple dielectric layers and multiple planar device layers having electrically conducting material. The filter section includes first and second symmetrical inductors formed in the substrate to provide filtering for an input signal. The filter section also includes a number of capacitors formed in the substrate and coupled to the inductors. The balun section includes an electrically conducting central transmission line input that is connected to an output of the filter, and first and second output structures for providing the output from the filter-balun combination. The input line follows a path through the substrate that includes first and second coil areas. The input line is sandwiched between upper and lower transmission lines in each of the first and second coil areas. The upper and lower transmission lines are coupled to first and second balun output structures, which provide a balanced signal as an output. The output of the filter-balun combination is a filtered, balanced signal at the first and second balun output structures.

In accordance with another aspect of the present invention, a filter for filtering a signal carried by a signal transmission line is provided. The filter is formed in a multi-layer planar substrate that includes multiple dielectric layers and multiple device layers having electrically conducting material. The filter includes symmetrical first and second inductors formed in the substrate, and also includes capacitors formed in the substrate and coupled to the inductors. A signal provided as an input to the filter is filtered by the inductors and capacitors, resulting in a filtered signal being provided at an output of the filter.

In accordance with yet another aspect of the present invention, a balun for joining a balanced signal carrying a transmission line and unbalanced transmission line is provided. The balun is formed in a multi-layer planar substrate, including multiple dielectric layers and multiple device layers including electrically conducting material. An input to the balun follows a path through the substrate that includes first and second coil areas. The balun input is sandwiched between upper and lower transmission lines as it travels through each of the first and second coil areas. The upper and lower transmission lines are coupled to first and second balun output structures, which provide a balanced signal as an output.

According to still another embodiment of the present invention, a filter-balun combination for filtering and balancing a signal is provided. The filter-balun combination is formed in a multi-layer planar substrate, including multiple dielectric layers and multiple device layers including electrically conducting material. The filter section includes symmetrical first and second inductors formed in the substrate, and also includes capacitors formed in the substrate and coupled to the inductors. The first and second inductors are symmetrical, and are formed such that corresponding parts of the first inductor are formed only in the same device layers as corresponding parts of the second inductor. The filter formed by the inductors and capacitors provides a filtered output signal to the balun. The balun section includes an electrically conducting central transmission line input that is connected to an output of the filter and forms a path through the substrate that includes first and second coil areas. The balun input is sandwiched between upper and lower transmission lines in the first and second coil areas. The upper and lower transmission lines are coupled to first and second balun output structures, which provide a balanced signal as an output. The output of the filter-balun combination is a filtered, balanced signal at the first and second balun output structures.

These and other features, advantages, and objects of the present invention will be further understood and appreciated by those skilled in the art by reference to the following specification, claims, and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
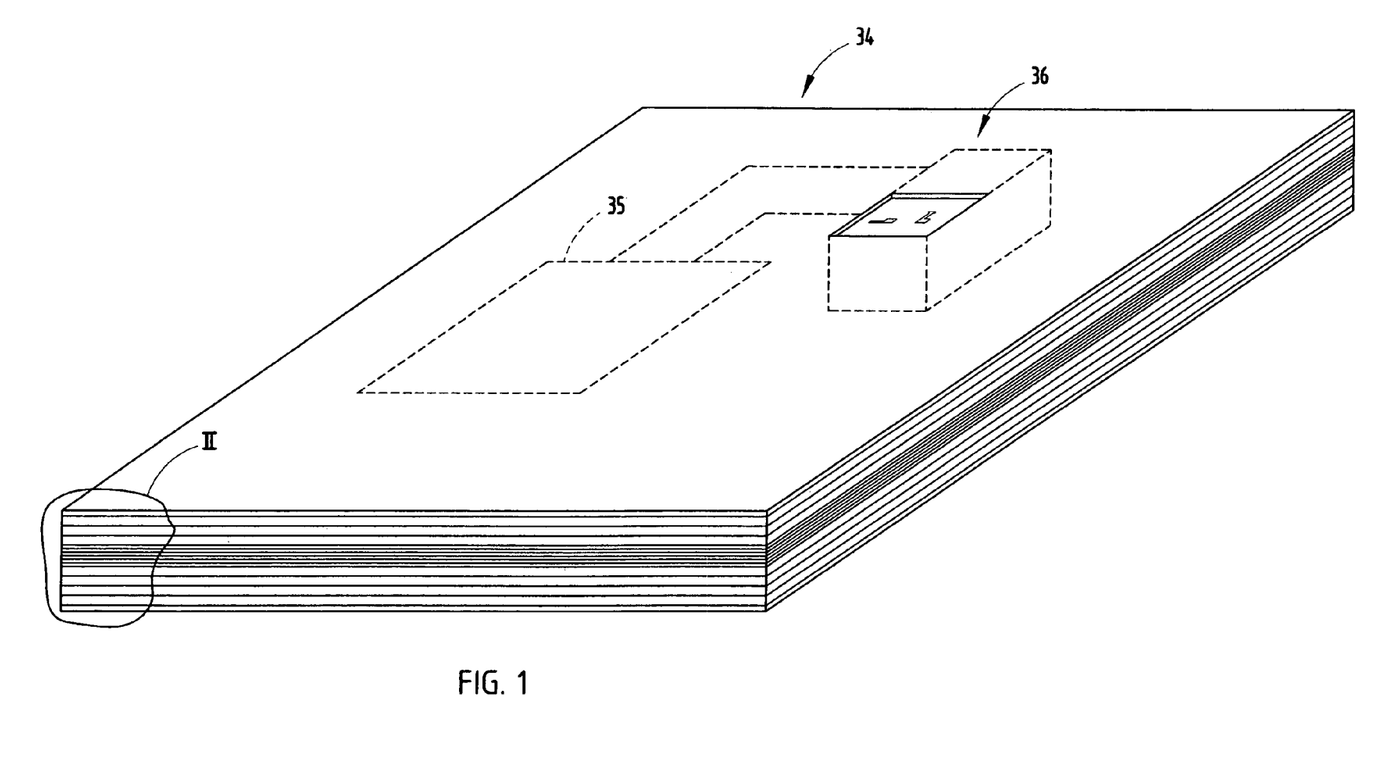
FIG. 1 is a perspective view of a multi-layer planar substrate including a filter-balun combination and other electronic circuitry, according to one embodiment of the present invention.

Referring to FIG. 1, a multi-layer planar substrate 34, including a filter-balun combination 36 and other electronic circuitry 35, is generally illustrated according to one embodiment of the present invention. As shown, multi-layer planar substrate 34 includes multiple planar dielectric layers and multiple planar device layers. The components forming filter-balun combination 36 are formed in the various layers of multi-layer planar substrate 34. Because most of the elements of filter-balun combination 36 are formed in the interior dielectric and device layers, they are hidden from view in FIG. 1. Multi-layer planar substrate 34 also includes electronic circuitry 35 formed in the various device layers and dielectric layers of the multi-planar substrate 34. Electronic circuitry 35 may include discrete electronic circuit elements, such as, for example, capacitors, resistors, and inductors. Electronic circuitry 35 may also include logic and memory circuitry.

According to one exemplary embodiment, electronic circuitry 35 is digital satellite receiver circuitry configured to receive and process XM satellite radio signals. In an alternative embodiment, electronic circuitry 35 is receiver circuitry configured to process electromagnetic signals other than XM satellite radio signals. As shown, filter-balun combination 36 is electrically coupled to electronic circuitry 35. In this manner, an electronic signal provided by electronic circuitry 35 is provided as an input to filter-balun combination 36. Filter-balun 36 combination filters and balances the signal, and provides the filtered and balanced signal as an output from filter-balun combination 36 for further processing by electronic circuitry 35.

Figure 2:
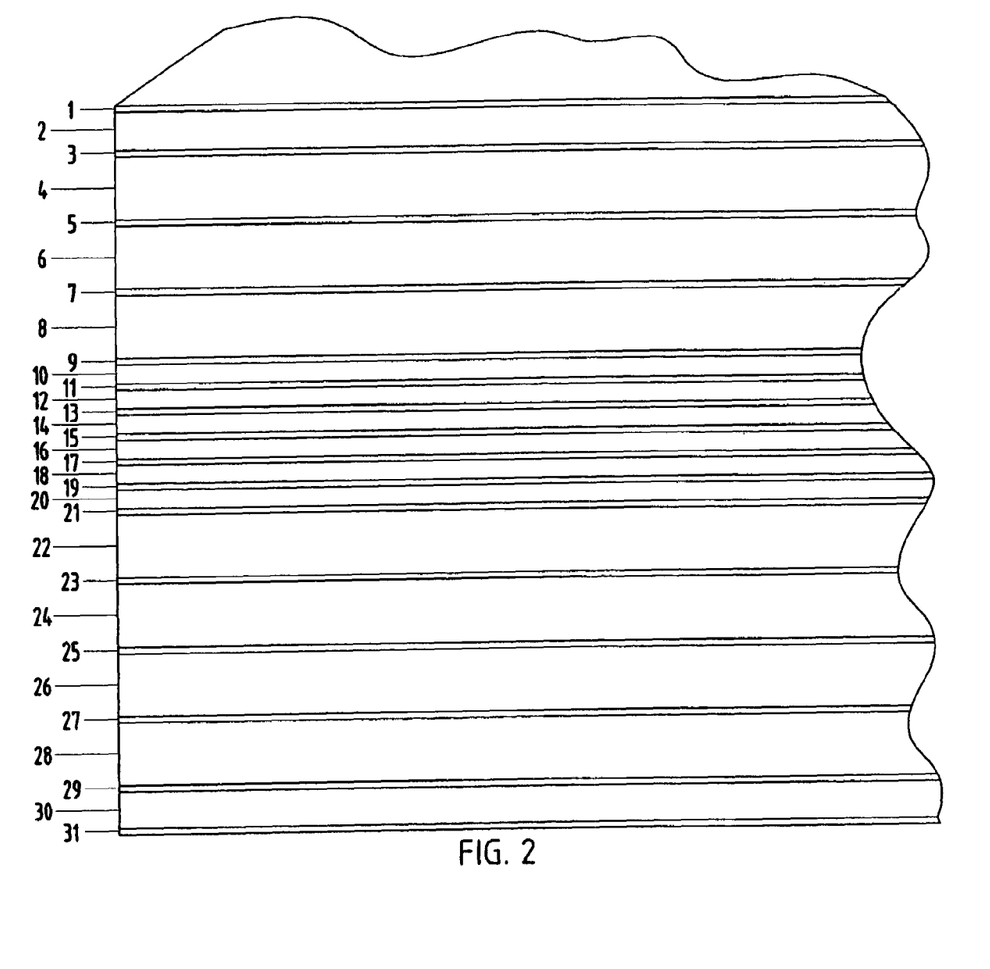
FIG. 2 is an enlarged view of section II of the multi-layer planar substrate of FIG. 1, showing multiple planar dielectric and device layers of the multi-layer planar substrate.

FIG. 2 provides a detailed cutout view of one corner of multi-layer planar substrate 34. Multi-layer planar substrate 34 includes multiple dielectric layers generally illustrated as even numbered layers 2–30. In one embodiment, the dielectric layers are made of low-temperature co-fired ceramic (LTCC). In an alternate embodiment, the dielectric layers are formed from any material suitable being used as a printed circuit board (PCB), such as FR4. Each of the multiple dielectric layers is shown having electrically conducting material deposited in layers or traces on its upper surface. In the present embodiment, conductive circuit traces and layers have been printed on the dielectric surfaces by means of a printing process. Electrically conducting material deposited on the upper surface of a dielectric layer is referred to in this application as an upper device layer. These device layers are generally illustrated as odd numbered layers 1–29. In addition, the lowermost dielectric layer 30 is also shown having a circuit layer or traces of conducting material deposited on its lower surface. This conducting material deposited on the lower surface of dielectric layer 30 is referred to as lower device layer 31.

Various device layers may be electrically coupled through intervening dielectric layers by means of conductive vias (not shown). To form conductive vias, holes formed in the dielectric layers are filled or coated with conducting material. The conducting material forms a conducting path between conducting traces or structures in one device layer and conducting traces or structures in another device layer.

Although multi-layer planar substrate 34 shows each dielectric layer surface in the corner area of FIG. 2 being in contact with a device layer, it should be appreciated that upper and/or lower device layers may be omitted in various embodiments of the invention, such that certain dielectric layers are not separated by device layers and/or such that the outermost upper and/or lower dielectric surfaces are not in contact with a device layer. Although in the corner area of substrate 34 shown in FIG. 2 each device layer is shown as a contiguous plane, it should be appreciated that a device layer could be a subset of a plane, such as a conductive trace or line. Although each device layer is shown having an approximately uniform thickness, it should also be appreciated that each device layer could have a different thickness. Finally, although multi-layer planar substrate 34 is shown including a total of 31 layers, it should be appreciated that a multi-layer planar substrate having more layers or fewer layers could be used to implement the teachings of the invention.

Figure 3:
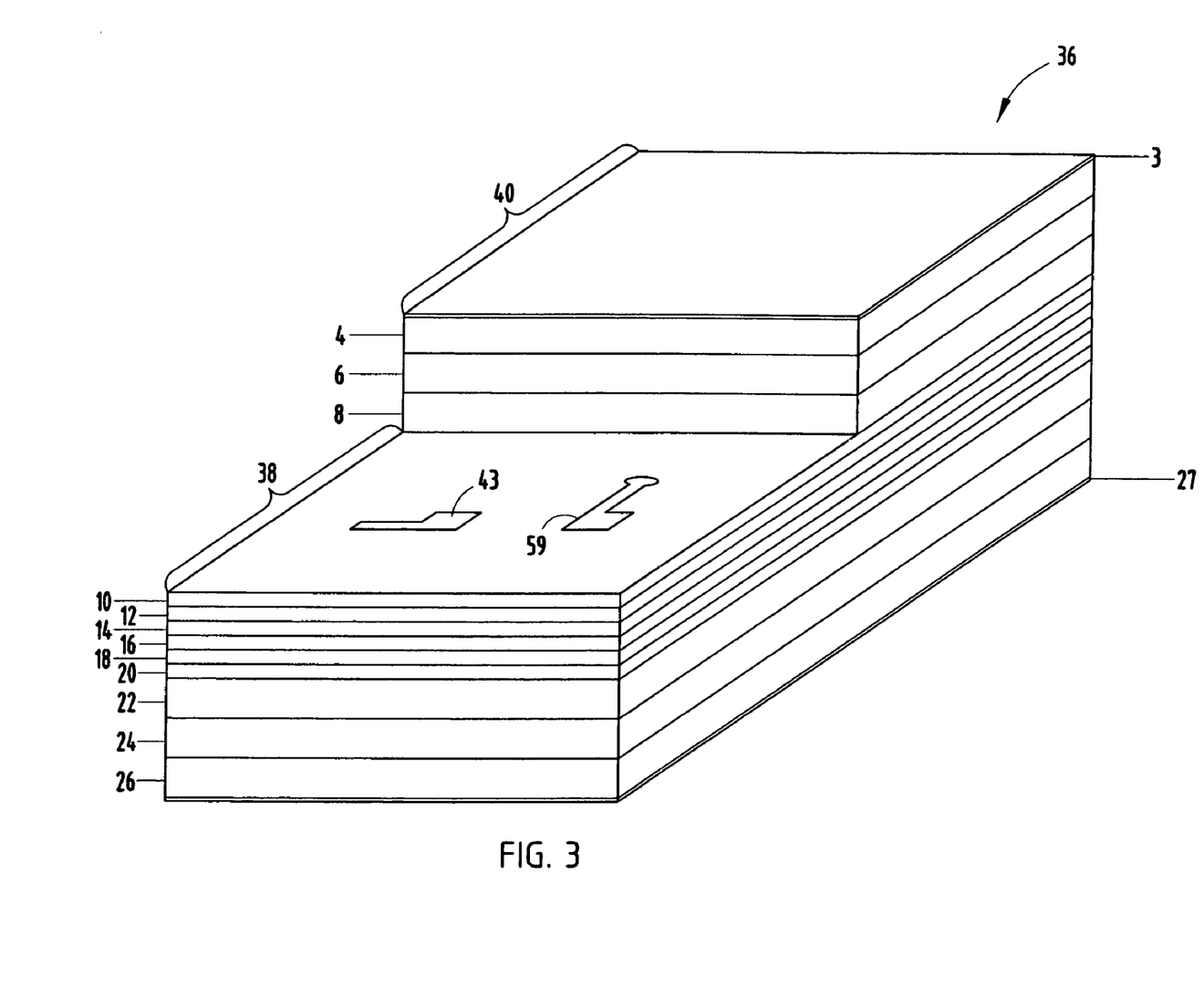
FIG. 3 is a perspective view of the filter-balun combination included in the multi-layer planar substrate of FIG. 1.

FIG. 3 provides an overview of the filter-balun combination 36, according to one embodiment of the present invention. As shown, filter-balun combination 36 includes a filter section 38 and a balun section 40. In the present embodiment, filter section 38 is formed in device layers 9 through 27 of substrate 34. Device layer 9, formed on the surface of dielectric layer 10, includes the uppermost circuit elements of filter section 38. In the embodiment shown, these elements are exposed to the air, as there are no intervening layers between device layer 9 of the filter section 38 and the upper surface of substrate 34.

Balun section 40 is shown formed in device layers 3 through 27. As shown, device layer 3 is a ground plane for circuitry in balun section 40. It should be appreciated that the uppermost device layer 3 of balun section 40 may be covered with additional dielectric layers and device layers that are part of layers 1–3 of substrate 34. Both filter section 38 and balun section 40 share a common lowermost layer device layer 27. In the present embodiment, device layer 27 is a ground plane for both filter section 38 and balun section 40. The ground plane at device layer 3 and ground plane at device layer 27 are connected by means of conductive vias.

Figure 4:
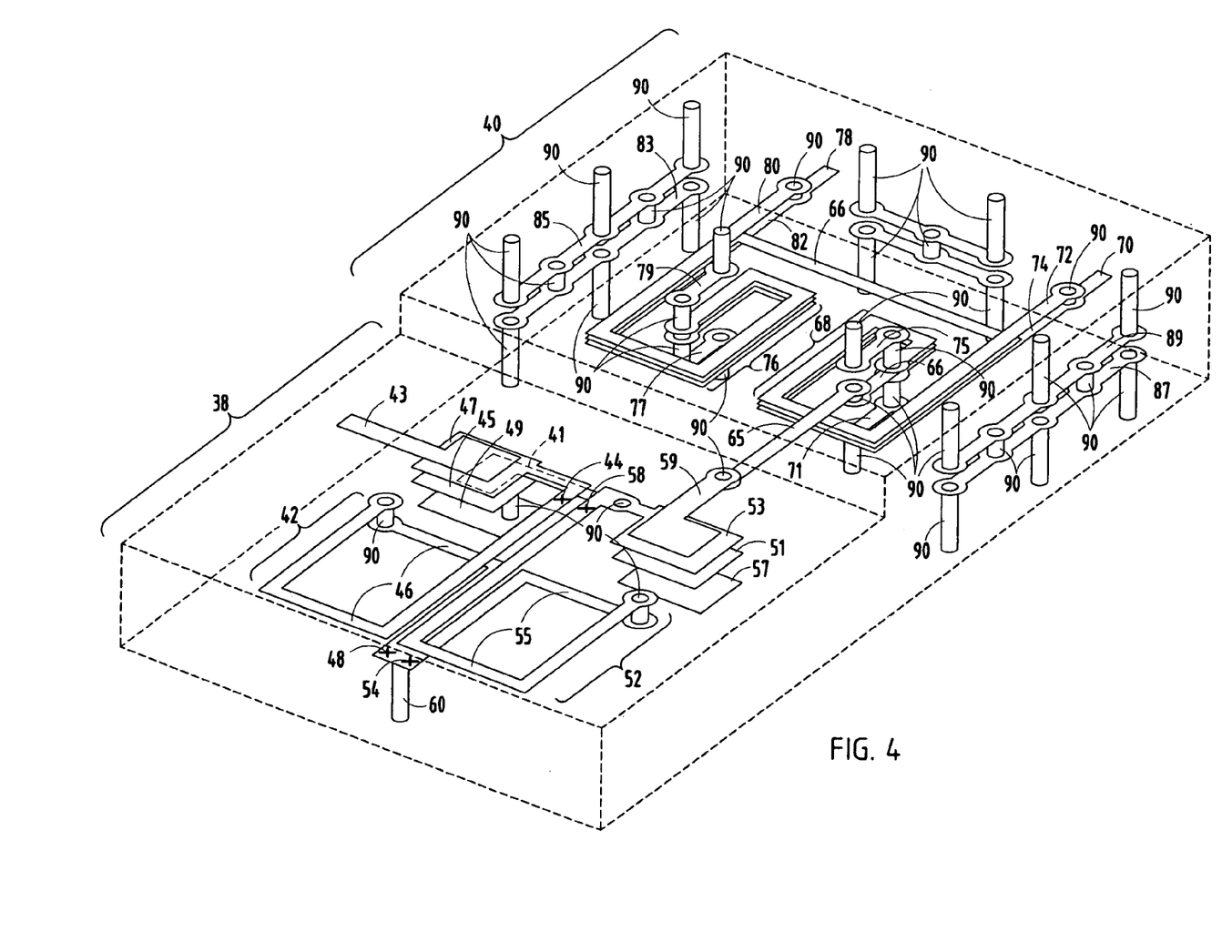
FIG. 4 is a detailed view of structures formed in the device layers of the filter-balun combination of FIG. 3.
Figures 5, 6:
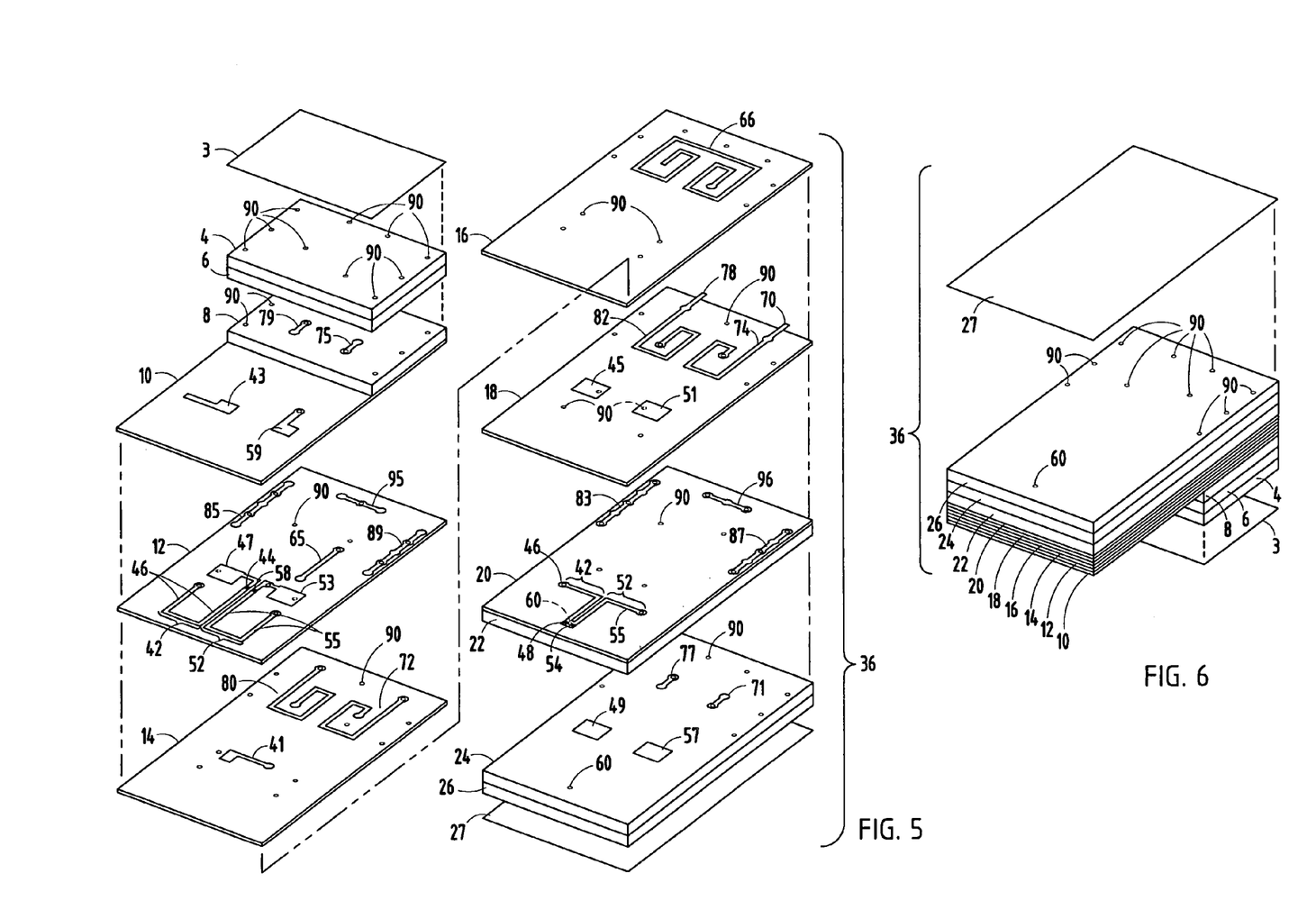
FIG. 5 is an exploded perspective view of several substrate layers of the filter-balun combination generally illustrated in FIG. 4.
FIG. 6 is an exploded perspective view generally illustrating the lowermost ground plane of the filter-balun combination of FIG. 4 and vias coupling the ground plane to the filter and balun.

FIGS. 4–7 provide detailed overviews of the filter-balun combination 36 of FIG. 3, according to one embodiment of the present invention. Filter-balun combination 36 includes both a filter section 38 and a balun section 40. Both the filter section 38 and balun section 40 are formed of electrically conducting elements in device layers of a multi-layer planar substrate having multiple device layers and multiple dielectric layers. In FIG. 4, dielectric layers in the multi-layer planar substrate are not shown so that the devices formed in the device layers of the multi-layer planar substrate 34, and the vias 60 and 90 connecting conducting structures formed in various device layers through various dielectric layers can be more easily seen. FIGS. 5 and 6 provide a view of the dielectric layers in the multi-planar substrate, along with electrically conducting structures formed in device layers on the surfaces of the dielectric layers.

A high-level overview of the filter-balun combination 36 will now be described. Filter section 38 includes a capacitive filter input 43 for receiving an input signal to be processed by the filter-balun combination 36. The filter section 38 also includes a capacitive filter output 59 for providing a filtered signal to the balun section 40. As shown, filter section 38 is a bandpass filter, including a first inductor 42, a second inductor 52, and capacitors coupled to the first and second inductors 42 and 52. Capacitors are formed by various conducting features/layers, including first filter input 43, conducting layers 47, 41, 45, and 49, and ground plane 27. Capacitors are also formed by filter output 59, conducting layers 53, 51, and 57, and ground plane 27. The capacitors, first inductor 42, and second inductor 52 are electrically coupled such that a signal provided at filter input 43 is filtered by the combination of the capacitors, first inductor 42, and second inductor 52 prior to being provided as an output by filter output 59. Filter section 38 is also shown in FIGS. 5–6 having a lower ground plane 27 coupled to first and second inductors 42 and 52 by means of a via 60. As shown, the upper surface of filter section 38, including filter input 43 and filter output 59, is not covered by a ground plane and is, instead, exposed to the air.

Balun 40 is shown having a balun input 65 coupled to filter output 59, a first balun output 70 for providing a first balun output signal, and a second balun output 78 for providing a second balun output signal. As shown, balun 40 converts an unbalanced signal provided at balun input 65 from filter output 59 into balanced output signals provided at first balun output 70 and second balun output 78. Balun 40 is also shown having first coil area 68 and second coil area 76 for converting the unbalanced input signal into balanced output signals. In FIG. 5, balun 40 is also shown connected to upper ground plane 3 and lower ground plane 27 by vias 90. In operation, a signal provided to filter input 43 is filtered by filter section 38 to remove unwanted components, and is further balanced by balun 40 before being output as balanced signals at first balun output 70 and second balun output 78.

Figure 7:
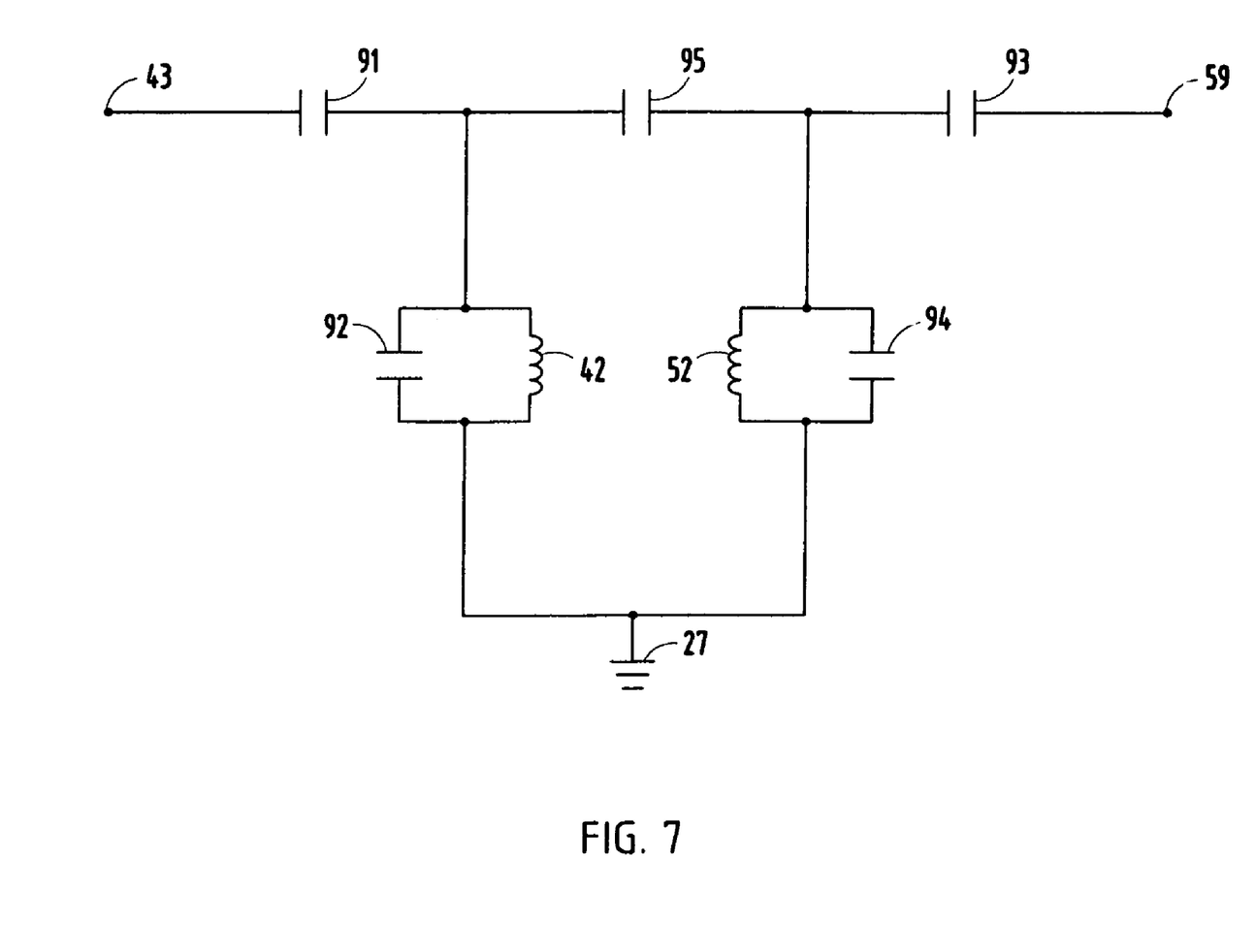
FIG. 7 is a circuit diagram generally illustrating the connections between capacitors and inductors of the embodiment of FIGS. 4–6.

A detailed description of each of the filter 38 and balun 40 will now be provided in turn. Filter 38 is formed by electrically conductive elements in device layers of a multi-layer planar substrate having multiple device layers and multiple dielectric layers. Filter 38 includes a first inductor 42 and a second inductor 52. Filter 38 also includes several capacitors 91–95 coupled to first inductor 42 and second inductor 52. The capacitors are formed by conducting elements in device layers of the multi-layer planar substrate. More specifically, capacitor 91 is formed by filter input 43 and conducting layer 47, capacitor 92 is formed by conducting layer 49 and ground plane 27, capacitor 93 is formed by filter output 59 and conducting layer 53, capacitor 94 is formed by conducting layer 57 and ground plane 27, and capacitor 95 is formed by conducting layers 41, 47, and 45. Conducting layers 47, 45, and 49 are electrically coupled together by means of conductive vias (not shown). Conducting layers 53, 51, and 57 are electrically coupled together by means of conductive vias (not shown). FIG. 7 provides a circuit diagram generally illustrating connections between inductors and capacitors of filter 38. As shown, filter 38 is a bandpass filter, with characteristics determined by the geometries of capacitors 91–95 and inductors 41 and 52.

Returning to FIGS. 4–6, filter 38 is shown having a first inductor 42 formed by electrically conducting lines 46. Electrically conducting lines 46 are formed in various device layers of a multi-layer planar substrate 34. As shown, electrically conducting lines 46 of first inductor 42 that are present in more than one device layer are electrically coupled through intervening dielectric layers by means of a conductive via 90. First inductor 42 also includes a first inductor output 48 and a first inductor input 44. First inductor input 44 is coupled to a conducting layer 47, which is electromagnetically coupled to filter input 43, such that a signal received by filter input 43 is provided to first inductor input 44. Filter input 43 is also electromagnetically coupled to conducting layer 41, such that a signal received by filter input 43 is also provided to conducting layer 41. As noted above, electrically conducting layer 47 is electrically coupled by means of vias to conducting layers 45 and 49.

Filter 38 also includes a second inductor 52 formed from electrically conducting lines 55. Electrically conducting lines 55 are formed in various device layers of multi-layer planar substrate 34. As with first inductor 42, electrically conducting lines 55 of second inductor 52 formed in different device layers of multi-layer planar substrate 34 are electrically coupled through intervening dielectric layers by means of a conductive via 90. Second inductor 52 also includes second inductor input 54 and second inductor output 58. As shown, first inductor output 48 and second inductor input 54 are electrically coupled together, and are coupled to a lower ground plane 27 (FIGS. 5–6) through intervening dielectric layers by means of a via 60.

As shown, first inductor 42 and second inductor 52 are symmetric about a plane separating the two inductors and perpendicular to the surface of multi-layer planar substrate 34. This means that corresponding segments of electrically conducting lines 46 and 55 are approximately equal in size and shape, and are formed in the same device layers of multi-layer planar substrate 34. By providing for the symmetry of first inductor 42 and second inductor 52, and by coupling both inductors 42 and 52 to the same ground plane 27 through a single via 60, it is possible to closely match the inductances of first inductor 42 and second inductor 52. In an alternative embodiment (not shown), corresponding segments of electrically conducting lines 46 and 55 are not all formed in the same device layers of multi-layer planar substrate 34.

Filter 38 is also shown having a filter output 59 electromagnetically coupled to a conducting layer 53. Second inductor output 58 is electrically coupled to conducting layer 53 such that an output signal of second inductor output 58 is conducted into filter output 59 as an output signal. As noted above, additional conducting layers 51 and 57 are electrically coupled to conducting layer 53 by means of a via (not shown). In addition, as shown, second inductor output 58 and conducting layer 53 are coupled to conducting layer 41.

In operation, filter 38 receives an input signal via filter input 43. The input signal is conducted into the first inductor input 44. The signal then travels from first inductor input 44 through the upper electrically conducting line 46 through via 90 to lower electrically conducting line 46, and on to first inductor output 48. The first inductor output 48 is grounded by means of conducting via 60. The signal in first inductor 42 electromagnetically couples to the second inductor 52 and travels from the second inductor input 54, which is grounded by means of conducting via 60, through lower electrically conducting line 55, through via 90 to upper electrically conducting line 55, and on to the second inductor output 58. The signal then travels from second inductor output 58 to a conducting layer 53 which is electrically coupled to second inductor output 58. The signal is then electromagnetically conducted from conducting layer 53 to filter output 59, where it is provided as an input signal to additional circuitry, such as balun 40. It should be noted that the length of the conducting path from first inductor input 44 through upper electrically conducting line 46, via 90, lower electrically conducting line 46, and first inductor output 48 to ground through via 60 forms a quarter wavelength microstrip transmission line shorted to ground, which is an LC resonator. It should also be noted that the length of the conducting path from second inductor output 58 through upper electrically conducting line 55, via 90, lower electrically conducting line 55, and second inductor input 54 to ground through via 60 forms a quarter wavelength microstrip transmission line shorted to ground, which is an LC resonator. Thus, second inductor 52 is an LC resonator coupled to first inductor 42, which is an LC resonator.

Although the present embodiment shows first and second inductors 42 and 52 having one turn each, it should be appreciated that first inductor 42 and second inductor 52 could have additional turns or fractions of turns, provided that the number of turns in first inductor 42 and second inductor 52 are equal and the symmetry between first inductor 42 and second inductor 52 is maintained. Finally, it should also be appreciated that although first and second inductors 42 and 52 are shown implemented in two device layers of multi-layer planar substrate 34, first inductor 42 and second inductor 52 could be implemented in additional layers connected by vias 90, provided that symmetry between first inductor 42 and second inductor 52 is maintained.

Turning now to a detailed discussion of balun 40, balun 40 is implemented in multiple device layers of a multi-layer planar substrate 34. Balun 40 is shown having a balun input 65 coupled to a filter output 59. In an alternative embodiment, circuitry other than filter output 59 is attached to balun input 65 to provide a balun input signal. As shown, balun input 65 is coupled to a central transmission line 66 by means of a conductive via 90. As shown, central transmission line 66 is a conductive circuit trace forming a path in a single device layer 15 on the upper surface of dielectric layer 16 of multi-layer planar substrate 34. In an alternative embodiment, central transmission line 66 follows a path through more than one device layer of a multi-layer substrate 34. The path followed by central transmission line 66 includes a first coil area 68, a second coil area 76, and a connecting segment joining the first coil area 68 to second coil area 76.

As central transmission line 66 follows a path through first coil area 68, it is substantially sandwiched between a first lower transmission line 74 and a first upper transmission line 72. First lower transmission line 74 is formed in a device layer located below the device layer of central transmission line 66, and is joined near one end to lower ground plane 27 by vias 90 and conducting structure 71. First upper transmission line 72 formed in a device layer located above the device layer of central transmission line 66, and is joined near one end to upper ground plane 3 by vias 90 and conducting element 75. First lower transmission line 74 and first upper transmission line 72 are joined together at the opposite end of the line by a via 90, and are coupled to first balun output 70 near where the two transmission lines 74 and 72 are joined together by via 90.

As central transmission line 66 travels through second coil area 76, it is substantially sandwiched between a second lower transmission line 82 and a second upper transmission line 80. Second lower transmission line 82 is formed in a device layer located below the device layer of central transmission line 66, and is coupled at one end to lower ground plane 27 by means of vias 90 and conducting element 77. Second upper transmission line 80 is formed in a device layer located above the device layer of central transmission line 66, and is coupled at one end to upper ground plane 3 by means of vias 90 and conducting element 79. Second lower transmission line 82 and second upper transmission line 80 are coupled together at ends opposite the ground plane connections by means of via 90, and are further coupled to second balun output 78. As shown, lower ground plane 27 and upper ground plane 3 are coupled together by means of vias 90 and conducting elements 83, 85, 87, and 89.

In operation, balun 40 receives an input signal via central transmission line 66 from filter output 59 of filter 38. As the signal carried by central transmission line 66 travels through first coil area 68, a signal is electromagnetically induced in first lower transmission line 74 and first upper transmission line 72. This induced signal is provided as a balun output at first balun output 70. As the signal received by central transmission line 66 continues through to second coil area 76, a signal is induced in second lower transmission line 82 and second upper transmission line 80. Second lower transmission line 82 and second upper transmission line 80 provide the induced signal as an output at second balun output 78. It should be appreciated that because of the length of transmission line 66, which is a half wavelength transmission line, and the configuration of the first and second coil areas 68 and 76, the output signals provided at first balun output 70 and second balun output 78 will be balanced, but will be approximately 180 degrees out of phase with each other. In this manner, an unbalanced signal provided as an input to central transmission line 66 is provided as a balanced signal at first balun output 70 and second balun output 78.

Although the present embodiment provides that the signal provided on central transmission line 66 is provided by filter 38, it should be appreciated that in an alternative embodiment, a signal to be processed by the balun 40 could be provided by circuitry other than filter 38.

The invention as described above advantageously provides for a filter-balun combination having a low insertion loss. The invention as described above also advantageously provides for a filter-balun combination in which filter characteristics can be more precisely controlled due to the symmetry between paired inductors used in the filter section. Improved symmetry can be achieved in spite of manufacturing process variation due to the fact that corresponding inductor elements are located in the same device layers, and due to the fact that both inductors are symmetrically tied to the same ground plane by a single via rather than multiple vias. In addition, efforts to decrease the insertion loss of the filter section are enhanced by the ability to leave the top of the filter section open and exposed to the air while maintaining the symmetry of the inductors employed in the filter section. The inventors have demonstrated a filter-balun combination of the present invention in which the combined filter-balun insertion loss is less than 1.5 dB at a center frequency of the filter. The invention also advantageously provides for reduced balun size, increased flexibility in conductor line routing, and tighter coupling due to the sandwiching of the balun input line between similarly routed output lines in different device layers. The sandwiched layers also prevent fringing fields from central transmission line 66 from propagating to conductive structures in the vicinity and degrading balun performance.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A filter-balun combination for filtering an input signal provided to the filter-balun combination and providing a balanced output signal from the filter-balun combination, comprising:

a multi-layer planar substrate including multiple planar dielectric layers, multiple planar device layers comprising conducting material, and multiple conducting structures electrically coupling conducting material in different device layers through at least one dielectric layer;

a filter comprising a first inductor and a second inductor, the first inductor comprising electrically conducting traces formed in at least one of said multiple planar device layers, said first inductor having an input, an output, and at least one turn, the second inductor comprising electrically conducting traces formed in at least one of said multiple planar device layers, said second inductor being symmetrical to said first inductor about a plane that is equidistant from said first and second inductors and perpendicular to the surface of said multi-layer planar substrate, said second inductor having an input coupled to the output of said first inductor, said second inductor further having an output; and a balun comprising a first electrically conducting central transmission line coupled to the output of said second inductor and forming in one of said multiple device layers a first path that includes first and second coil areas, said balun further comprising first and second output structures, each of which includes upper and lower electrically conducting transmission lines having first and second ends, the transmission lines forming substantially overlapping paths in planar device layers located above and below the device layer of said first electrically conducting central transmission line, wherein the substantially overlapping paths of said upper and lower electrically conducting transmission lines of the first output structure substantially overlap the first path of said first electrically conducting transmission line in the first coil area, and wherein the substantially overlapping paths of said upper and lower electrically conducting transmission lines of the second output structure substantially overlap the first path of said first electrically conducting central transmission line in the second coil area, and wherein the upper electrically conducting transmission line and lower electrically conducting transmission line of each of the first and second output structures are electrically coupled near where the electrically conducting transmission lines terminate and provide a signal output at the first ends of the transmission lines.

2. The filter-balun combination of claim 1, further comprising:
a first ground plane located in a device layer different from the device layer of the first electrically conducting central transmission line; and
a second ground plane located in a different device layer from said first ground plane and said first electrically conducting central transmission line, wherein the upper electrically conducting transmission line of each of the first and second output structures is electrically connected to said first ground plane at the second end of the upper electrically conducting transmission lines, and wherein the lower electrically conducting transmission lines are electrically connected to said second ground plane at the second end of the lower electrically conducting transmission lines.

3. The filter-balun combination of claim 1, wherein the multiple planar dielectric layers comprise low-temperature co-fired ceramic.

4. The filter-balun combination of claim 1, further comprising a single electrically conductive via connecting the output of said first inductor, the input of said second inductor, and a ground plane formed in a device layer of the substrate.

5. The filter-balun combination of claim 1, wherein the uppermost device layer of the filter is at least partially exposed to air.

6. The filter-balun combination of claim 1, further comprising satellite radio receiver circuitry formed in said multi-layer planar substrate, wherein a signal provided to said input of said filter is filtered by said filter and balanced by said balun before being provided to said satellite radio receiver circuitry for further processing.

7. The filter-balun combination of claim 1, wherein said filter and balun have a combined insertion loss of less than 1.5 dB at a center frequency of the filter.

8. The filter-balun combination of claim 1, wherein said filter is a bandpass filter.

9. The filter-balun combination of claim 1, wherein said second inductor is formed only in the same at least one of said multiple planar device layers as said first inductor.

10. A filter for filtering a signal carried by a signal transmission line, comprising:
a multi-layer planar substrate including multiple planar dielectric layers, multiple planar device layers comprising conducting material, and multiple conducting structures electrically coupling conducting material in different device layers through at least one dielectric layer;
a first inductor comprising electrically conducting traces formed in at least one of said multiple planar device layers, said first inductor having an input, and output, and at least one turn; and
a second inductor comprising electrically conducting traces formed in at least one of said multiple planar device layers, said second inductor being symmetrical to said first inductor about a plane that is equidistant from said first and second inductors and perpendicular to the surface of said multi-layer planar substrate, said second inductor having an input coupled to the output of said first inductor, said second inductor further having an output configured to provide a filtered signal to additional processing circuitry.

11. The filter of claim 10, wherein said second inductor is formed only in the same at least one of said multiple planar device layers as said first inductor.

12. The filter of claim 10, wherein the multiple planar dielectric layers comprise low-temperature co-fired ceramic.

13. The filter of claim 10, further comprising a single electrically conductive via connecting the output of said first inductor, the input of said second inductor, and a ground plane formed in a device layer of the substrate.

14. The filter of claim 10, wherein the filter is a band-pass filter.

15. The filter of claim 10, wherein the uppermost device layer is at least partially exposed to air.

16. The filter of claim 10, further comprising satellite radio receiver circuitry formed in said multi-layer planar substrate, wherein a signal provided to said input of said filter is filtered by said filter before being provided to said satellite radio receiver circuitry for further processing.

17. A balun for joining a balanced signal-carrying transmission line to an unbalanced transmission line, comprising:
a multi-layer planar substrate including multiple planar dielectric layers, multiple planar device layers comprising conducting material, and multiple conducting structures electrically coupling conducting material in different device layers through at least one dielectric layer; and
a balun comprising a first electrically conducting central transmission line configured to receive and carry an electromagnetic signal, said electrically conducting central transmission line forming in one of said multiple device layers a first path that includes first and second coil areas, said balun further comprising first and second output structures, each of which includes upper and lower electrically conducting transmission lines having first and second ends, the transmission lines forming substantially overlapping paths in planar device layers located above and below the device layer of said first electrically conducting central transmission line, wherein the substantially overlapping paths of said upper and lower electrically conducting transmission lines of the first output structure substantially overlap the first path of said first electrically conducting central transmission line in the first coil area, and wherein the substantially overlapping paths of said upper and lower electrically conducting transmission lines of the second output structure substantially overlap the first path of said first electrically conducting central transmission line in the second coil area, and wherein the upper electrically conducting transmission line and lower electrically conducting transmission line of each of the first and second output structures are electrically coupled near where the electrically conducting transmission lines terminate and provide a signal output at the first ends of the transmission lines.

18. The balun of claim 17, further comprising:
a first ground plane located in a device layer different from the device layer of the first electrically conducting central transmission line; and
a second ground plane located in a different device layer from said first ground plane and said first electrically conducting central transmission line, wherein the upper electrically conducting transmission line of each of the first and second output structures is electrically connected to said first ground plane at the second end of the upper electrically conducting transmission lines, and wherein the lower electrically conducting transmission lines are electrically connected to said second ground plane at the second end of the lower electrically conducting transmission lines.

19. The balun of claim 17, wherein the multiple planar dielectric layers comprise low-temperature co-fired ceramic.

20. The balun of claim 17, further comprising satellite radio receiver circuitry formed in said substrate, wherein a signal provided to said first electrically conducting central transmission line is balanced by said balun before being provided by said first and second output structures to said satellite radio receiver circuitry for further processing.

21. A filter-balun combination for filtering an input signal provided to the filter-balun combination and providing a balanced output signal from the filter-balun combination, comprising:
a multi-layer planar substrate including multiple planar dielectric layers, multiple planar device layers comprising conducting material, and multiple conducting structures electrically coupling conducting material in different device layers through at least one dielectric layer;
a filter comprising a first inductor and a second inductor, the first inductor comprising electrically conducting traces formed in at least one of said multiple planar device layers, said first inductor having an input, an output, and at least one turn, the second inductor comprising electrically conducting traces formed only in the same at least one of said multiple planar device layers as said first inductor, said second inductor being symmetrical to said first inductor about a plane that is equidistant from said first and second inductors and perpendicular to the surface of said multi-layer planar substrate, said second inductor having an input coupled to the output of said first inductor, said second inductor further having an output; and
a balun comprising a first electrically conducting central transmission line coupled to the output of said second inductor and forming in one of said multiple device layers a first path that includes first and second coil areas, said balun further comprising first and second output structures, each of which includes upper and lower electrically conducting transmission lines having first and second ends, the transmission lines forming substantially overlapping paths in planar device layers located above and below the device layer of said first electrically conducting central transmission line, wherein the substantially overlapping paths of said upper and lower electrically conducting transmission lines of the first output structure substantially overlap the first path of said first electrically conducting central transmission line in the first coil area, and wherein the substantially overlapping paths of said upper and lower electrically conducting transmission lines of the second output structure substantially overlap the first path of said first electrically conducting central transmission line in the second coil area, and wherein the upper electrically conducting transmission line and lower electrically conducting transmission line of each of the first and second output structures are electrically coupled near where the electrically conducting transmission lines terminate and provide a signal output at the first ends of the transmission lines.

* * * * *